United States Patent [19]

Schlosser

[11] 3,806,826

[45] Apr. 23, 1974

[54] DIGITAL CIRCUIT FOR ADJUSTING THE FREQUENCY OF A VARIABLE FREQUENCY OSCILLATOR

[75] Inventor: Karl Schlosser, Planegg, Germany

[73] Assignee: Siemens Aktiengesellschaft, Berlin and Munich, Germany

[22] Filed: Dec. 15, 1972

[21] Appl. No.: 315,505

[30] Foreign Application Priority Data

Dec. 22, 1971 Germany .......................... 2164007

[52] U.S. Cl. .................................. 331/1 A, 331/16

[51] Int. Cl. ............................................ H03b 3/04

[58] Field of Search ............................ 331/1 A, 16

[56] References Cited

UNITED STATES PATENTS

| | | | |
|---|---|---|---|
| 3,185,938 | 5/1965 | Pelosi | 331/11 |
| 3,651,422 | 3/1972 | Underhill | 331/14 |
| 3,689,849 | 9/1972 | Swanson et al. | 331/1 A |
| 3,753,141 | 8/1973 | Elk et al. | 331/1 A |

*Primary Examiner*—John Kominski
*Attorney, Agent, or Firm*—Hill, Sherman, Meroni, Gross & Simpson

[57] ABSTRACT

In a circuit for controlling the frequency of a variable frequency oscillator, a first counter is provided for counting the cycles produced by the oscillator during a predetermined interval of time, and a comparator produces first and second outputs in response to a difference between the content of said first counter after the predetermined interval and a preselected quantity, according to the sign of the difference. A pair of gates are connected to the first and second outputs and to a source of clock pulses, and the gates are adapted to convey clock pulses to the first counter for incrementing or decrementing the content of the first counter, in response to which of the pair of gates is enabled, until said comparator recognizes a comparison between the content of the first counter and the preselected quantity. A digital to analog converter is responsive to the output of the second counter to produce a dc voltage to control the frequency of the variable frequency oscillator.

11 Claims, 3 Drawing Figures

DIGITAL CIRCUIT FOR ADJUSTING THE FREQUENCY OF A VARIABLE FREQUENCY OSCILLATOR

BACKGROUND OF THE INVENTION

1. Field of the Invention

The present invention relates to a variable frequency oscillator and more particularly to a variable frequency oscillator which can be controlled in its frequency by digital means.

2. The Prior Art

Several systems have been devised in the prior art for controlling the frequency of a variable frequency oscillator by digital means, and for changing the oscillator frequency in response thereto. Generally these systems employ a counter for counting the cycles of the a.c. voltage produced by the oscillator until a predetermined number of cycles has been accumulated, and then comparing the time interval during which said counting occurs with a predetermined standard time interval. However, such systems have proven disadvantageous in the case of very high oscillator frequencies, which employ the use of an extremely short time interval, if the capacity of the counter for monitoring the frequency of the oscillator is to be kept small. Such systems are also disadvantageous when the selected number of pulses to be counted by the counter requires several inter-stage transitions among the successive stages of a counter, which increase the time required for the counter to manifest the prescribed number beyond the time required for the oscillator to produce the prescribed number of cycles.

It is, therefore, desirable to provide a mechanism for regulating the frequency of the variable frequency oscillator which avoids the aforesaid disadvantages.

SUMMARY OF THE INVENTION

It is a principal object of the present invention to provide a mechanism for regulating the frequency of a variable frequency oscillator which does not require a comparison of time intervals.

It is a further object of the present invention to provide such apparatus which has increased accuracy and flexibility, especially for very high oscillator frequencies.

A further object of the present invention is to provide such apparatus in which fewer stages are required for the counter needed to monitor the output of the variable frequency oscillator.

These and other objects and advantages of the present invention will become manifest upon an examination of the following description and the accompanying drawings.

In one illustrative embodiment of the present invention there is provided a counter for counting the number of cycles produced by the variable frequency oscillator during a predetermined time interval, means for comparing the quantity accumulated in said counter during said interval with a desired quantity, means for changing the content of a second counter by an amount corresponding to the difference between the content of the first counter and the desired quantity, and an analog to digital converter for converting the content of the second counter into a d.c. voltage for controlling the frequency of said variable frequency oscillator.

In another embodiment of the invention there is provided means for continually manifesting the number of cycles counted by said oscillator during the predetermined time interval, so that the oscillator frequency is continuously manifested.

In still another embodiment of the present invention there is provided means for augmenting the analog signal produced by the digital to analog converter in response to the content of the second counter, to minimize the capacity needed for the counters employed in the present invention, and to maximize the rate at which the frequency of the variable frequency oscillator is corrected to a desired frequency.

BRIEF DESCRIPTION OF THE DRAWINGS

Reference will now be made to the accompanying drawings in which.

DESCRIPTION OF THE PREFERRED EMBODIMENTS

Figure 1:
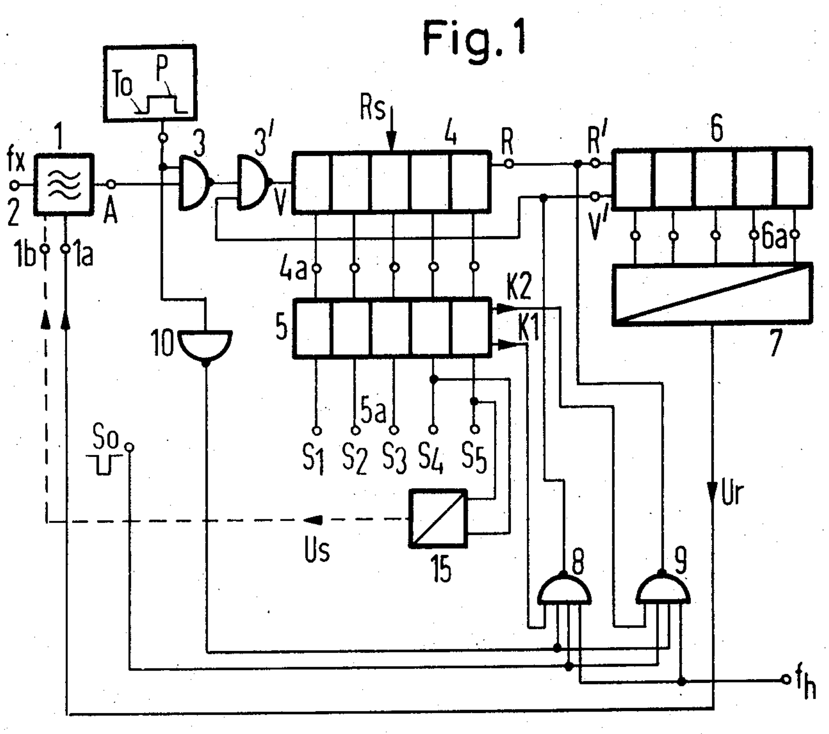
FIG. 1 is a functional block diagram of an illustrative embodiment of the present invention.

Referring now to FIG. 1 there is shown an illustrative embodiment of the present invention, incorporating a variable frequency oscillator 1 for generating a frequency $f_x$. The oscillator 1 is provided with two output terminals 2 and A, which may conveniently furnish outputs of the frequency generated by the oscillator 1 to two different locations. Alternatively, a single output of the oscillator 1 may be supplied by means interconnecting the terminals 2 and A. The frequency of the oscillator 1 is controlled by the voltage presented to the oscillator at a terminal 1*a*, and the means for regulating the level of this voltage will be described hereinafter.

The terminal A is connected to one input of an NAND gate 3, which has the second input connected to the output of a pulse generator 20 which periodically produces a pulse P having a duration $T_0$. The output of the NAND gate 3 is connected to one input of an NAND gate 3′, the output of which is connected to the input V of a multistage binary counter 4. The binary counter 4 is adapted to be preset to any desired initial state by means of a plurality of inputs represented by the arrow $R_s$. The binary counter 4 is conventional in construction and is preferably composed of a plurality of flip-flops connected in cascade relation, so that the output of the flip-flop provided for each stage represents in digital fashion the instantaneous content of such stage. Such outputs, one from each stage, are connected in parallel fashion by means of lines 4*a* to input terminals of a comparator unit 5. Another set of inputs to the comparator unit 5 is supplied by the terminals S1, S2, S3, S4 and S5 connected to the comparator 5 by way of lines 5*a*. The comparator unit 5 functions to compare the combination of voltage levels supplied on the lines 4*a* with those supplied on the lines 5*a*. When the numerical value of the binary number represented by the levels on the lines 4*a* exceeds the number represented by the levels on the lines 5*a* an output K2 is made high. On the other hand, when the number represented by the levels on the lines 4*a* is less than the number represented by the levels on the lines 5*a* the output K1 is energized. The K1 output is connected to one input of an NAND gate 8 which has three other inputs connected respectively to an input terminal supplied with clock pulses at a frequency $F_h$, the output of an inverter 10 having an input connected to the pulse generator 20, and a terminal 22 to which is connected a control pulse $S_0$. The $S_0$ signal inhibits the gate 8 prior to the pulse P, and the input from the inverter 10 inhibits the gate 8 during the duration of the pulse P produced by the pulse generator 20.

The K2 output of the comparator 5 is connected as one input to the NAND gate 9, which has three other inputs connected respectively to the terminals supplied with the clock pulses at frequency $F_h$, the output of the inverter 10 and the terminal supplied with the control pulse $S_0$.

When the K1 output of the comparator is manifested the gate 8 is enabled to pass the clock pulses from the clock pulse terminal following the end of the pulse P produced by the pulse generator 20. When the K2 output is manifested, the gate 9 is enabled.

The output of the gate 8 is connected as a second input to the NAND gate 3' and serves to further increment or advance the state of the counter 4 by counting clock pulses from the terminal $F_h$ following the end of the pulse P. On the other hand, the output of the gate 9 is connected to another terminal R of the counter 4, which is the reverse input, and causes the state of the counter 4 to be reduced or decremented for each pulse supplied by the gate 9. Accordingly, when the gate 8 is energized when the content of the counter 4 is deficient in comparrison with the desired frequency represented by the condition of the input terminals S1–S5, the counter 4 is advanced by the clock pulses $F_h$ until the input to the comparator 5 on the lines 4*a* is the same as the input on the lines 5*a*, bringing about an end to the signal on the K1 output, thus cutting off the gate 8. On the other hand, when the frequency of the oscillator 1 is too high and an excess number of pulses are counted by the counter 4 during the period of the pulse P, the counter is decremented by clock pulses $F_h$ until the desired number is manifested, by the counter 4 after which the K2 output vanishes and the gate 9 is cut off. The number of additional pulses counted (in either the forward or the reverse direction) by the counter 4, after the end of the pulse P, is manifested in a counter 6.

The counter 6 is composed of a plurality of flip-flops connected in cascade relationship, just as is the counter 4. It is supplied with two inputs which are respectively V' and R', which respectively cause the counter 6 to be incremented and decremented in response to pulses appearing thereat. The instantaneous condition of the flip-flops of the counter 6 is manifested by a plurality of output lines 6*a* which are connected as inputs to a digital to analog converter 7. The output $U_r$ of the digital to analog converter 7 is supplied to the terminal 1*a* and controls the frequency of the oscillator 1.

Whatever the initial state of the counter 6, when it is incremented as a result of additional pulses being supplied to the counter 4 by the gate 8, it is incremented to a larger value, bringing about a higher voltage level $U_r$ at the terminal 1*a*. This brings about an increase in the frequency of the oscillator 1, which is a change of the oscillator frequency in the desired direction, tending to produce a greater number of pulses during the period of a pulse P produced by the pulse generator 20. Successive pulses of the pulse generator 20 may result in successive increases to the content of the counter 6, with a result that the value of the voltage $U_r$ produced by the digital to analog converter 7 is raised sufficiently to permit the oscillator 1 to produce the desired frequency. When the desired frequency is reached the comparator 5 recognizes a coincidence between the levels on the lines 4*a* and 5*a*, and neither the K1 output nor the K2 output is energized.

Figure 2:
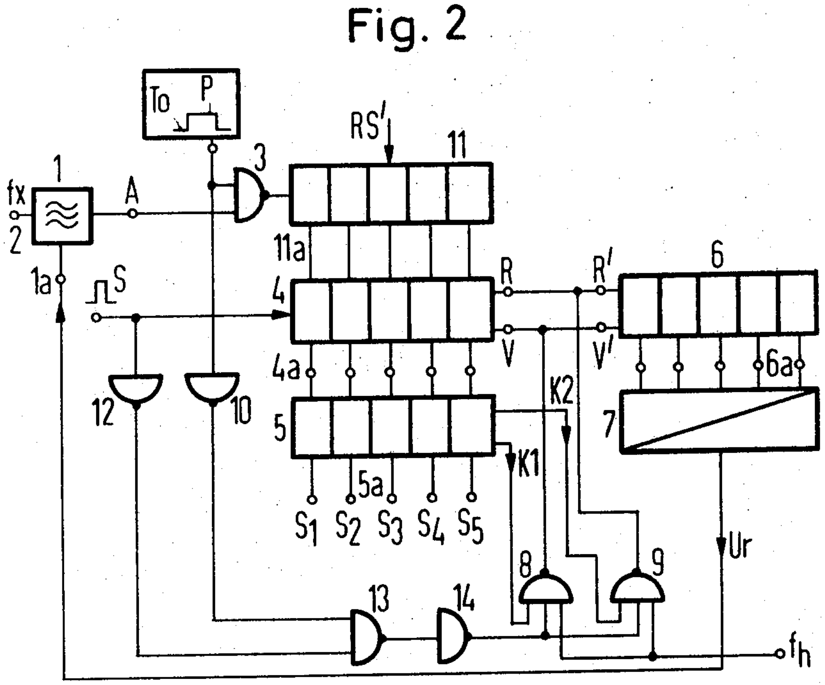
FIG. 2 is a functional block diagram of an alternative embodiment of the present invention.

As an optional feature, a second digital analog converter 15 may be connected to the highest order ones S4 and S5 of the input terminals S1–S5, so that the controlling voltage on the oscillator 1 is controlled in part directly by the voltage levels connected to the terminals S4 and S5. In this way when the frequency of the oscillator 1 is to be changed, and the voltage level applied to the terminal S4 or S5 is changed, this is reflected immediately in the output $U_s$ of the digital to analog converter 15, which is connected to a controlling input terminal 1*b* of the oscillator 1. The terminal 1*b* may be a separate control terminal of the oscillator 1, which is provided for the same purpose, and with the same effect, as the terminal 1*a*. Alternatively, the voltage levels on the two inputs 1*a* and 1*b* may be summed together in a resistor network or the like, to produce a single voltage level for controlling the frequency of the oscillator 1. Thus, when the condition of the inputs S4 and S5 is changed, a rapid frequency shift of the oscillator 1 is brought about immediately. In this manner the number of stages required for the counter 6 is minimized, since the maximum frequency deviation is relatively small. Referring now to FIG. 2 a second illustrative embodiment of the present invention is shown. Corresponding parts, which are the same as those described in connection with FIG. 1, are identified with like reference numerals, and the description of them in connection with FIG. 1 will suffice for FIG. 2 as well.

The circuit of FIG. 2 is provided with an additional counter 11, which is connected to the terminal A of the oscillator 1 through the NAND gate 3, and preset by the signals RS'. When desired, in response to a transfer pulse S, provided at a terminal 24, the content of the counter 11 is transferred in parallel to corresponding stages of the counter 4, where it is compared in he comparator 5 with the levels present at the input terminals S1–S5. The transfer pulse S is connected through an inverter 12 to one input of an NAND gate 13 which has its other input connnected to the output of the inverter 10. An inverter 14 is connected to the output of the NAND gate 13 to produce a positive output of the end of the pulse P produced by the pulse generator 20. The transfer pulse S, like the pulse $S_0$ in FIG. 1, inhibits the gates 8 and 9 during the period when the counter 11 (or 4) is preset and thereafter until the beginning of the pulse P. The gates 8 and 9 are thus inhibited from operating during the duration of the pulse S and during the duration of the pulse P.

The advantage of the apparatus of FIG. 2 is that the counter 11 maintains a representation of the frequency of the oscillator 1 between the pulses produced by the pulse generator 20. By connecting the counter 11 to suitable readout means a visual indication of the frequency may be manifested. Alternatively, the quantity stored in the counter 11 may be read out to another register to furnish an input to a digital computer or the like.

Figure 3:
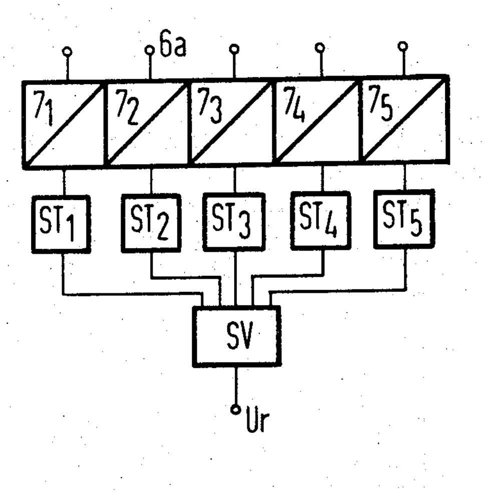
FIG. 3 is a functional block diagram of a digital to analog converter circuit incorporated in the apparatus of FIGS. 1 and 2.

FIG. 3 is a functional block diagram of one form of the digital to analog converter 7 incorporated in both FIG. 1 and FIG. 2. As illustrated in FIG. 3 the digital to analog converter comprises five binary storage sections 71–75, each of which is adapted to store the binary value supplied to it over one of the lines 6*a* and to supply an input to an individual digital to analog converter unit ST1–ST5 connected thereto. Five such units ST1–ST5 are provided, one for each of the storage devices 71–75. The five units ST1–ST5 are each adapted to produce a voltage level, when actuated by its respective storage device 71–75. The voltage level selected by each of the digital to analog converter units has a predetermined level in accordance with the order of the corresponding position in the counter 6. Accordingly, the voltage level produced by the unit ST2 is twice as high as that produced by the unit ST1, the voltage level produced by the unit ST3 is twice as high as that produced by the unit ST2, and so on. The units ST1–ST5 may conveniently be voltage dividers. The independent levels produced by each of the digital to analog converter units ST1–ST5 are added in a voltage adder unit SV, which may conveniently be a conventional resistor mixing network to produce an output voltage U.

In a modified arrangement of the present invention a plurality of gates are interposed between the outputs of the counter 6 and the storage devices 71–75, and such gates are actuated after the counting of the counter 6 is completed, so that the manifestation of the digital to analog converter unit 7 remains uninterrupted during the counting of the counter 6.

It will be appreciated from the foregoing that the present invention is effective to control the frequency of a variable frequency oscillator and that no comparison of time intervals is required. The apparatus operates effectively during a predetermined constant time period for each cycle of operation, and the number of cycles produced by the variable frequency oscillator during that time interval are compared to the quantity desired during the interval, with the difference therebetween serving to modify the frequency produced by the variable frequency oscillator on a continuous basis.

The apparatus of the present invention is effective to control the frequency of the oscillator 1 even at very high frequencies, because the counting of the different pulses in the counter 6 takes place at the frequency of the clock pulse source at a frequency $f_h$. This frequency may be made as low as desired, simply by spacing out the pulses P from the pulse generator 20 to ensure a complete cycle of the counters for each pulse P. The use of a low frequency for the difference pulses ensures accuracy because the time required for the counter 6 to stabilize its condition after each input pulse is short in relation to the period of the pulses applied thereto, and, therefore, do not affect operation of the apparatus. If desired, the frequency $f_h$ may be derived from the frequency of the oscillator 1 by means of a frequency divider.

The inputs R*s* (FIG. 1) and RS′ (FIG. 2) are energized before each pulse P in order to reset them to zero, so that the same number of pulses is necessary in each cycle to reach the state corresponding to the terminals S1–S5. Alternatively, the inputs Rs and RS′ may preset the counters to a selected initial state, which would then change the number of pulses necessary to reach the final state.

What is claimed is:

1. In apparatus for controlling the frequency of a variable frequency oscillator the combination comprising: a first counter connected to the output of said oscillator and operative to count the cycles produced by said oscillator during a predetermined time interval to manifest a value proportional to the frequency of said oscillator, a comparator circuit, means connecting said first counter with said comparator, means for connecting an input signal representative of a desired frequency to said comparator, said comparator being operative to provide a control voltage in response to the difference between the content of said first counter after said interval and the value represented by said input signal, a source of auxiliary clock pulses, means for supplying said clock pulses to said first counter for counting said first counter forwardly or backwardly to adjust its content so as to compare with said input signal, a second counter, means for incrementing said second counter in response to each clock pulse applied to count said first counter forwardly, means for decrementing said second counter in response to each clock pulse applied to count said first counter backwardly, means for deriving a control voltage from the content of said second counter, and means for connecting said control voltage to said variable frequency oscillator for controlling the frequency thereof.

2. Apparatus according to claim 1, including a gate interconnected with said oscillator and with said first counter, and means connected to said gate for enabling said gate to pass pulses from said oscillator to said counter during said interval.

3. Apparatus according to claim 1, wherein said comparator has a first plurality of inputs connected individually to the stages of said first counter, and a second plurality of inputs adapted to be connected to signals representative of the desired frequency of said oscillator, for producing an output at a first output terminal when the signals applied to said first terminals represent a quantity smaller than that represented by signals applied to said second terminals, and for producing an output at a second output terminal when the signals applied to said first terminals represents a quantity larger than that represented by signals applied to said second terminals.

4. Apparatus according to claim 3, including gage means connected to one of said output terminals and to a source of clock pulses for connecting said clock pulses to said counter.

5. Apparatus according to claim 3, including a first gate having inputs connected to said output terminal and to a source of clock pulses and an output connected to a forward counting input of said counter, and a second gate having inputs connected to said second output terminal and to said source of clock pulses and an output connected to a backward counting input to said counter.

6. Apparatus according to claim 5, including means for connecting the output of said first gate to a forward counting input of said second counter, and means for connecting the output of said second gate to a backward counting input of said second counter.

7. Apparatus according to claim 1, wherein said means for deriving a control voltage from said second counter comprises a digital to analog converter, said digital to analog converter comprising a series of voltage dividers, one for each stage of said counter, said voltage dividers each producing individual output voltages in response to its associated counter stage being in a particular condition, and means for summing the voltages produced by said voltage dividers.

8. Apparatus according to claim 1, wherein said means connecting said first counter with said comparator comprises a third counter having a plurality of stages, one for each stage of said first counter, and means for transferring the content of every stage of said first counter into a corresponding stage of said third counter.

9. Apparatus according to claim 1, wherein said source of auxilliary clock pulses produces a train of said pulses at a pulse repetition rate which is lower than the frequency of said oscillator.

10. Apparatus according to claim 1, including means for developing a second control voltage in response to the magnitude of said desired frequency, and means for connecting said second control voltage to said oscillator for controlling the frequency thereof.

11. Apparatus according to claim 10, including a plurality of input terminals adapted to be connected to signals representative of the desired frequency of said oscillator, and digital to analog converter means connected to the highest order one of said terminals for producing said second control voltage in response to the signal connected to said highest order terminal.

* * * * *